(12) United States Patent
Watanabe et al.

(10) Patent No.: US 8,648,313 B2
(45) Date of Patent: Feb. 11, 2014

(54) SILICON DRIFT X-RAY DETECTOR

(75) Inventors: Toshiyoshi Watanabe, Tokyo (JP); Kouji Miyatake, Tokyo (JP)

(73) Assignee: JEOL Ltd., Tokyo (JP)

( * ) Notice: Subject to any disclaimer, the term of this patent is extended or adjusted under 35 U.S.C. 154(b) by 1082 days.

(21) Appl. No.: 12/646,496

(22) Filed: Dec. 23, 2009

(65) Prior Publication Data

US 2010/0163742 A1   Jul. 1, 2010

(30) Foreign Application Priority Data

Dec. 25, 2008   (JP) ................................. 2008-330339

(51) Int. Cl.
*G01T 1/24* (2006.01)

(52) U.S. Cl.
USPC ............. 250/370.15; 250/370.01; 250/370.06

(58) Field of Classification Search
USPC ........................... 250/370.15, 370.01, 370.06
See application file for complete search history.

(56) References Cited

U.S. PATENT DOCUMENTS 2,461,801 A * 2/1949 Armstrong .................... 250/253
5,075,555 A * 12/1991 Woldseth et al. ......... 250/370.15
7,193,216 B2   3/2007 Kiuru
7,449,131 B2 * 11/2008 Hayner et al. ................ 252/478
7,812,316 B2 * 10/2010 Hansen et al. ........... 250/370.14

FOREIGN PATENT DOCUMENTS

| JP | 2005-308632 A | 11/2005 |
| JP | 2006-119141 A | 5/2006 |
| WO | WO 2007/017272 | * 2/2007 |

OTHER PUBLICATIONS

Zhou et al., "Pulsed cooling of inhomogeneous thermoelectric materials." J. Phys. D: Appl. Phys. 40 (2007), pp. 4376-4381.*

* cited by examiner

*Primary Examiner* — David Porta
*Assistant Examiner* — Mindy Vu
(74) *Attorney, Agent, or Firm* — The Webb Law Firm (57) ABSTRACT

A silicon drift detector has an X-ray detection device, an electrode terminal subassembly for electrical connection, a Peltier device, and first and second shields formed between the electrode terminal subassembly and the Peltier device. The first shield is made of a material consisting chiefly of an element having an atomic number smaller than the average atomic numbers of the elements included in the material of the Peltier device. The second shield is made of a material consisting chiefly of an element having an atomic number greater than the atomic numbers of the elements included in the material of the Peltier device.

13 Claims, 11 Drawing Sheets

PRIOR ART

FIG. 11

SILICON DRIFT X-RAY DETECTOR

BACKGROUND OF THE INVENTION

1. Field of the Invention

The present invention relates to an X-ray detector used to detect X-rays in an energy-dispersive X-ray spectrometer (EDS) that is mounted in a transmission electron microscope (TEM), scanning electron microscope (SEM), X-ray fluorescent analyzer (XRF), or other similar instrument and, more particularly, to a technique for reducing the background of X-rays detected by a silicon drift X-ray detector (SDD).

2. Description of Related Art

Figure 9:
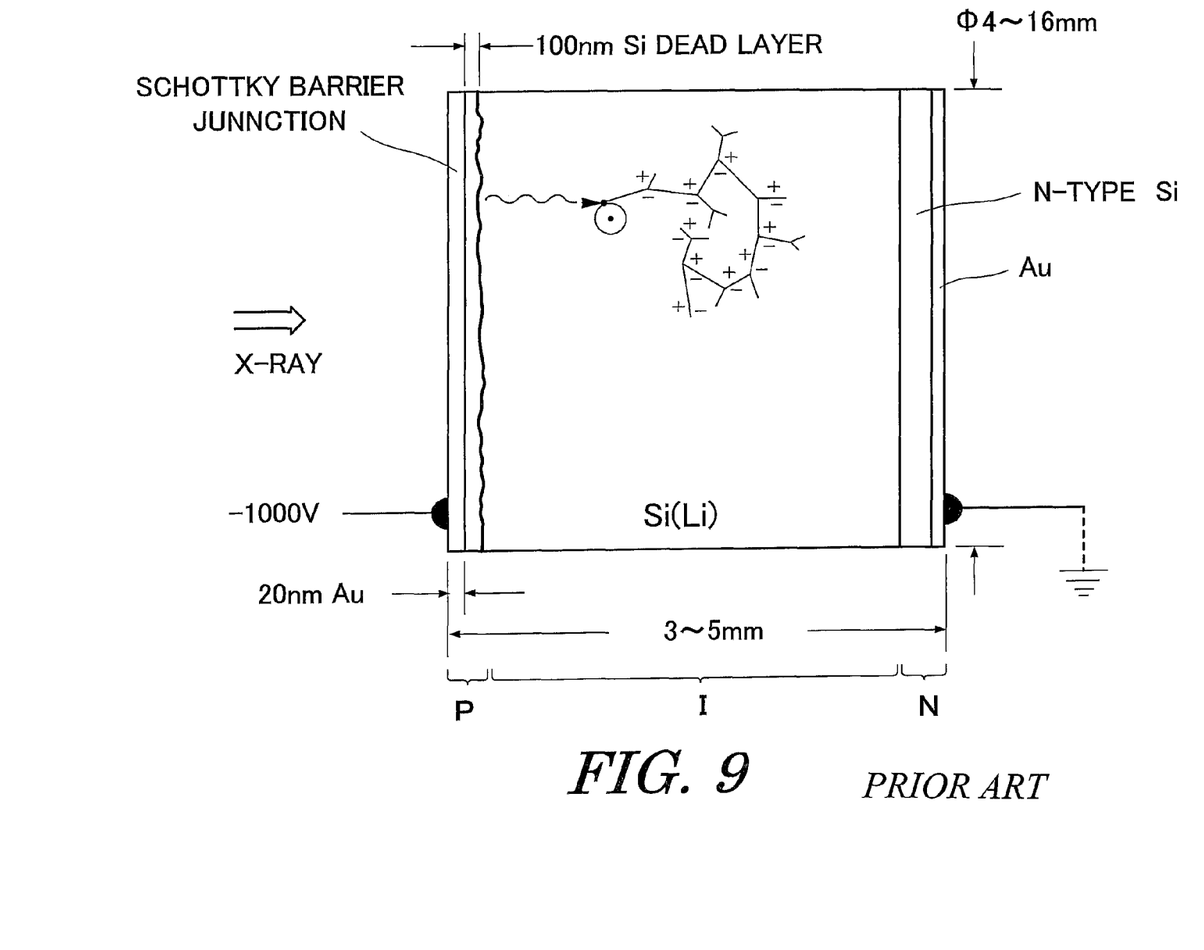
FIG. 9 illustrates the principle of a PIN detector consisting of silicon (Si) doped with lithium (Li)

A PIN detector consisting of silicon (Si) doped with lithium (Li) as shown in FIG. 9 has been available as a semiconductor X-ray detector used in EDS. The semiconductor device of FIG. 9 is a PIN diode to which a reverse bias is applied. The gate of a field-effect transistor (FET) is connected with one electrode of the PIN diode. When X-rays produced from a sample impinge on the PIN semiconductor, ion pairs whose number corresponds to the energy of X-ray quanta are created. The generated ion pairs are separated to thereby induce an electron avalanche by the reverse bias voltage applied to the semiconductor. The ion pairs are attracted toward the electrode. A current variation signal having an amplitude proportional to the energy of the X-ray quanta impinging on the PIN diode is extracted by varying the potential at the FET gate electrode. When X-rays are detected with a PIN detector, it is necessary to cool the PIN diode and FET with liquid nitrogen.

Figure 5:
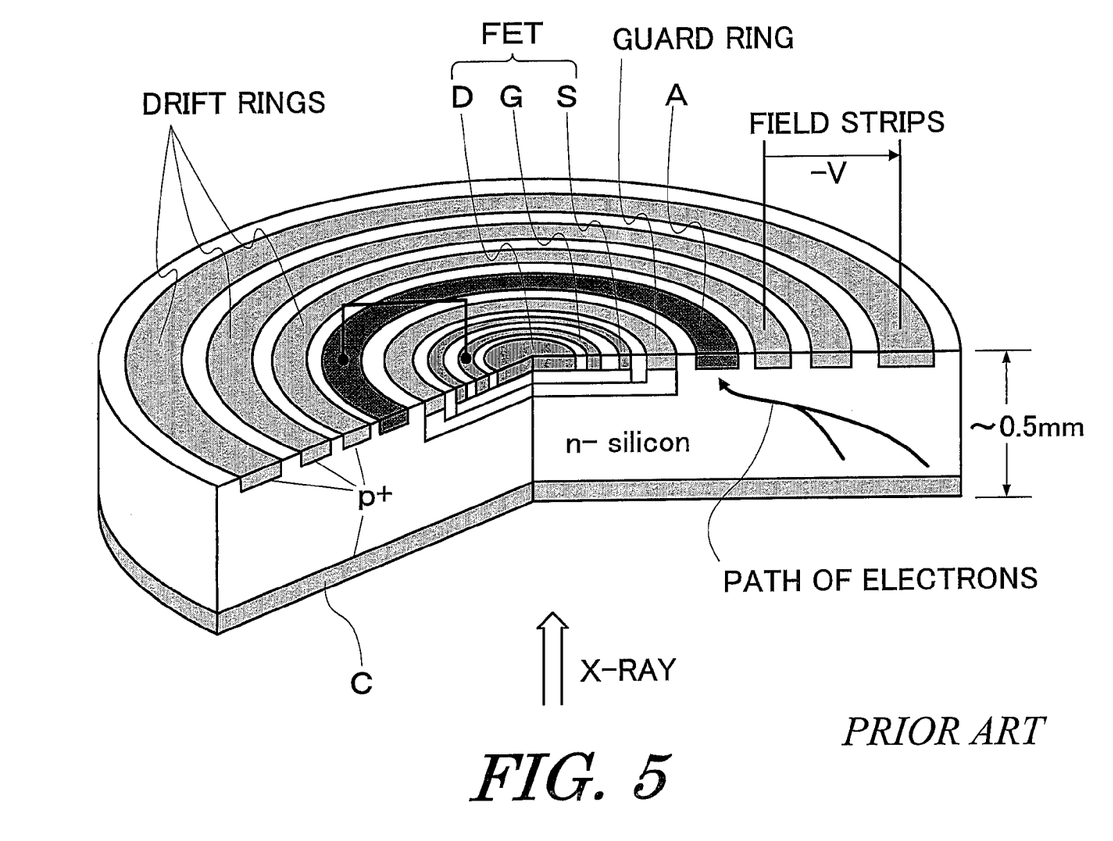
FIG. 5 is a partially cutaway perspective view illustrating the principle of a silicon drift X-ray detector.

The SDD is a relatively recently developed X-ray detector permitting high count-rate measurements of X-rays in contrast with PIN detectors. The SDD is greatly different in structure from the PIN detector. The SDD is now briefly described by referring to FIG. 5, which schematically shows the structure of the X-ray detection device of the SDD. FIG. 5 is a partially cutaway view to facilitate understanding of the cross-sectional structure.

X-rays to be detected enter the X-ray detection device from the side of the cathode (C) (from the lower side of the drawing). The FET forming a part of the PIN detector is a separate device wire-connected. The FET of the SDD is fabricated on the rear surface of the X-ray detection device as shown in FIG. 5. That is, the FET has drain (D), gate (G), and source (S) as its electrodes. These gates are arranged in this order from the inner side on the X-ray detection device.

In order to enable high count-rate measurements of X-rays, it is necessary to minimize the time (time constant) during which ion pairs created by the X-rays incident on the X-ray detection device are electrically extracted. To reduce the time constant, the electrical parasitic capacitance of the X-ray detection device must be reduced. In the SDD, the parasitic capacitance is reduced by reducing the size of the anode (A) of the X-ray detection device, and by arranging the FET integrally with the X-ray detection device. However, electrons produced by X-ray impingement can be well guided to the anode only if the size of the anode is reduced. Therefore, as shown in FIG. 5, multi-stage annular rings (referred to as field strips) (more rings are formed in practical instrumentation) are mounted. A successively changing negative potential bias is applied to the rings from the innermost ring closest to the anode toward the outwardmost ring. Electrons are moved along stepwise electric fields applied to the field strips. Finally, the electrons are concentrated into the anode. The anode is connected with the gate electrode of the FET. A current variation signal having an amplitude proportional to the energy of the X-ray quanta impinging on the SDD is extracted by varying the potential at the gate electrode of the FET.

As the thickness of the X-ray detection device is increased, it is necessary to increase the reverse bias voltage applied to each field strip accordingly. However, if this voltage is increased excessively, it is necessary to satisfy stringent protective conditions (e.g., the inside of the container accommodating the X-ray detection device must be kept at a high vacuum). To strike a compromise between the protective conditions and the performance, the thickness of the X-ray detection device is set to about 0.5 mm, which is smaller than the thickness of the PIN detector.

The SDD normally provides electronic cooling using a Peltier device. One feature of the SDD is that energy resolution comparable to that achieved by a PIN X-ray detector is obtained by providing only cooling using a Peltier device without depending on liquid nitrogen. Another feature of the SDD is that the whole detector, including the cooling mechanism using a Peltier device, is miniaturized and made lighter. Consequently, it is easy to mount the SDD in an apparatus.

Figure 3:
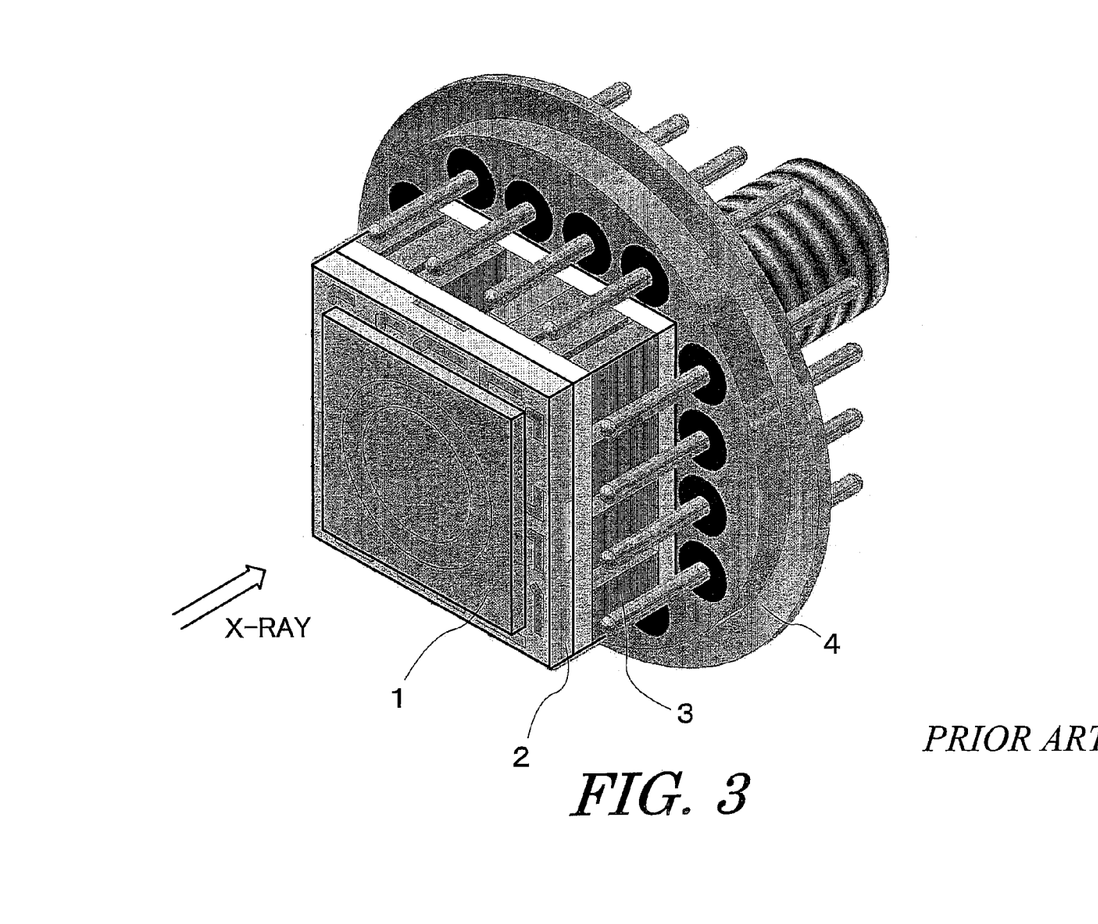
FIG. 3 is a perspective view of a silicon drift X-ray detector.
Figure 4:
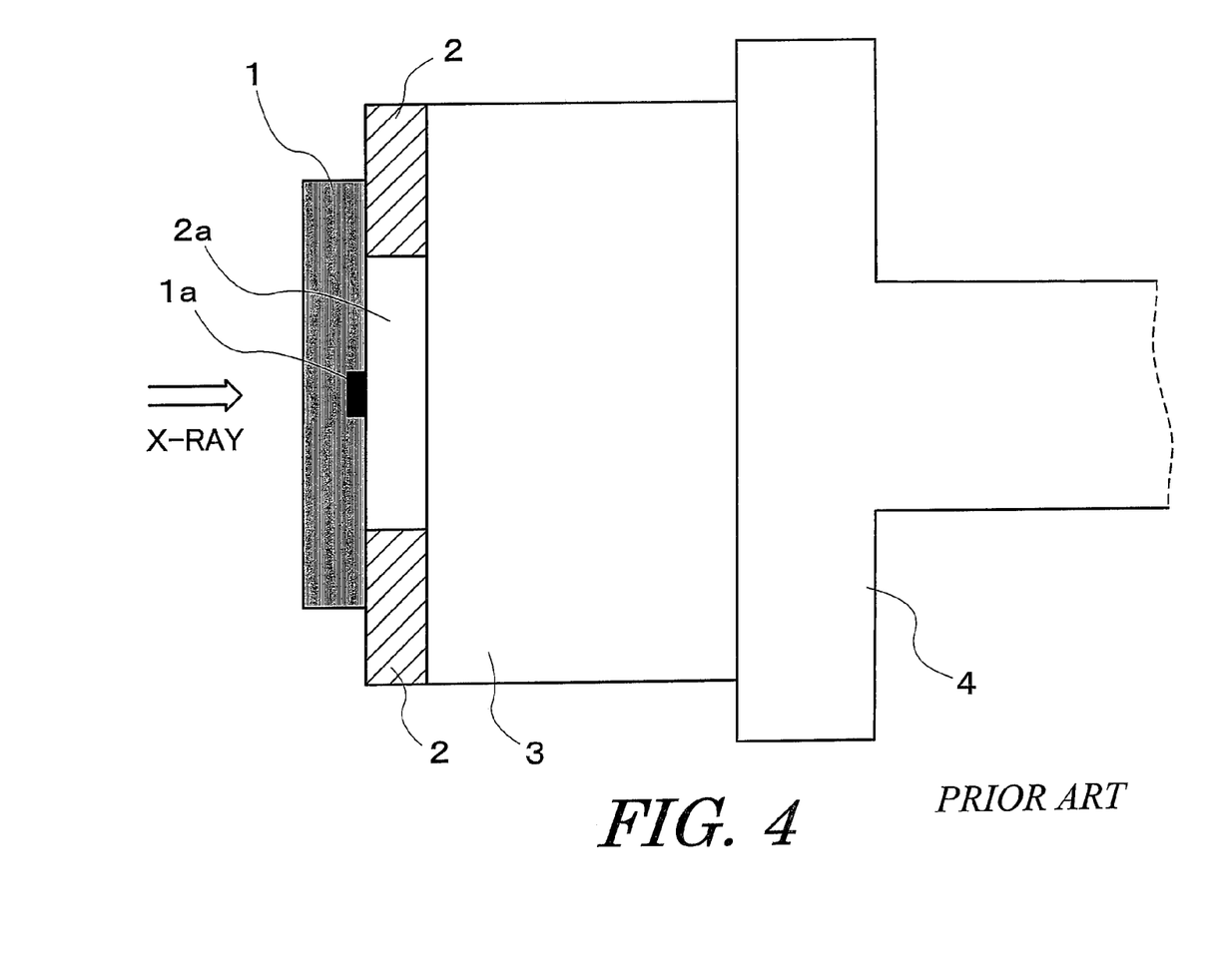
FIG. 4 is a cross-sectional view of another silicon drift X-ray detector.

FIG. 3 is a fragmentary perspective view of an SDD in which a Peltier device is mounted. FIG. 4 is a cross-sectional view of the SDD shown in FIG. 3. The SDD has an X-ray detection device 1 having a rear surface to which an FET 1a is coupled. An electrode terminal subassembly 2 has electrical wiring for electrically connecting the X-ray detection device 1 and the FET 1a. The SDD further includes a Peltier device 3 and a rear thermal conductor 4. The electrode terminal subassembly 2 assumes a frame-like form and is provided with an opening 2a. The terminal subassembly 2 is in contact with the outer peripheral portions of the X-ray detection device 1 and holds it. Accordingly, a gap is left between the rear surface of the device 1 on which the FET is disposed and the Peltier device 3. The Peltier device 3 is mounted as close as possible to the X-ray detection device 1 via the electrode terminal subassembly 2 such that the detection device 1 can be cooled in a short time.

JP-A-2006-119141 discloses a technique for correcting variations in dependence of the charge-voltage conversion rate of SDD. JP-A-2005-308632 discloses a technique using a Peltier device for cooling of a PIN semiconductor device.

As described previously, the thickness of the X-ray detection device of the SDD is about 0.5 mm, which is considerably thinner than the prior art Si (Li) semiconductor device. Therefore, the ratio of the X-rays reaching the Peltier device mounted behind the X-ray detection device after passing through the X-ray detection device to the X-rays incident on the detector is high. Because the Peltier device is made of a material containing rich amounts of elements of high atomic numbers, secondary X-rays of relatively high energies are produced from the Peltier device. There is the problem that the background increases because the secondary X-rays enter the X-ray detection device from the rear surface and become detected.

Another problem arises from the fact that the Peltier device is mounted close to the X-ray detection device. A large direct electric current flows through the Peltier device. The current produces a magnetic field. If magnetic parts are present nearby, the magnetic field is complicated. If the direct current varies or noise is superimposed on it, the magnetic field is made more complex. An X-ray detector mounted in a TEM or SEM is disposed as close as possible to the investigated sample on which an electron beam impinges, in order to enhance the sensitivity at which X-rays to be observed are detected. However, as shown in FIGS. 3 and 4, the Peltier device for cooling the X-ray detection device is also brought close to the sample. Therefore, the electron beam impinging on the sample is affected by the magnetic field produced by the Peltier device, thus adversely affecting the performance of the electron microscope. This problem is not serious where the SDD is mounted in an XRF. However, this problem becomes serious when the SDD is mounted in an electron beam apparatus, such as a TEM or SEM, for analyzing a sample by irradiating the sample with an electron beam and spectrally detecting characteristic X-rays emanating from the sample. This problem becomes more conspicuous in a case where the SDD is mounted in a TEM as described below.

Figure 6:
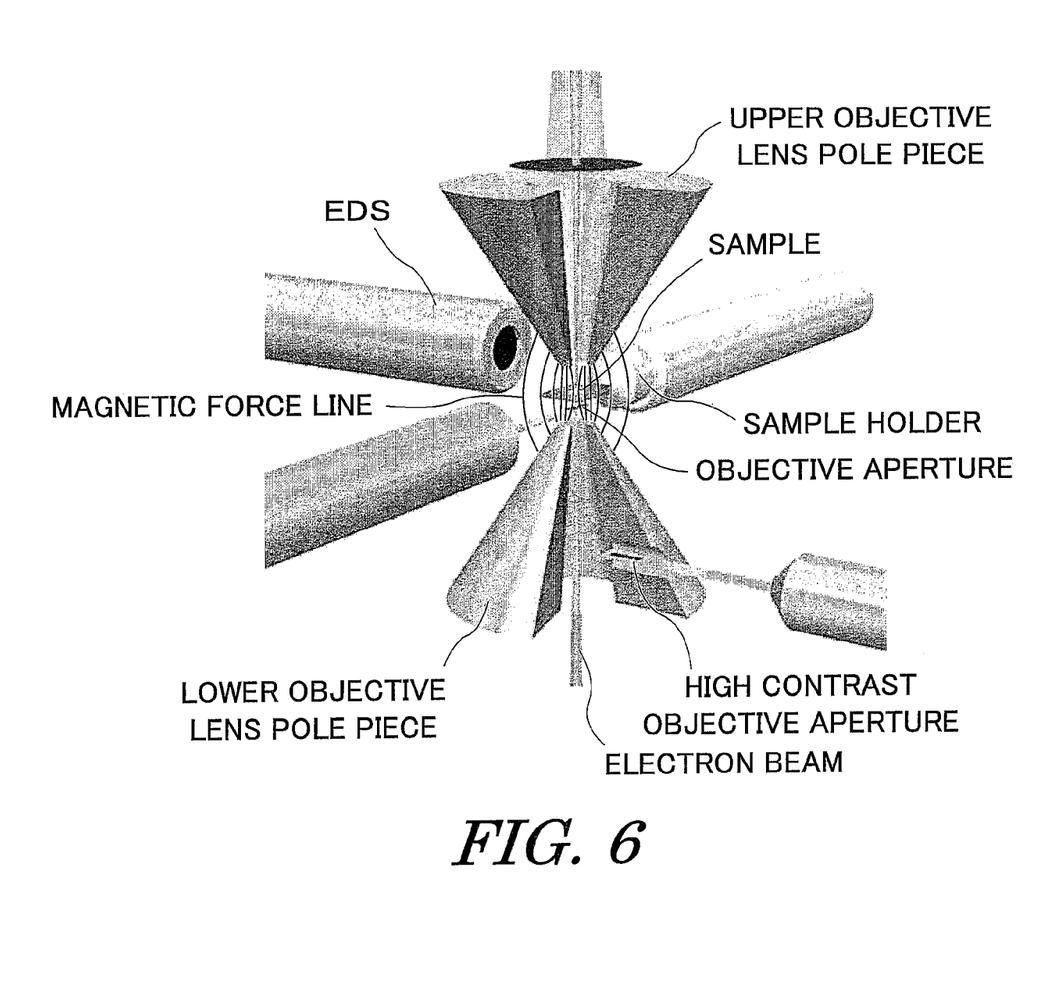
FIG. 6 depicts the manner in which a silicon drift X-ray detector is installed in a transmission electron microscope.

FIG. 6 is a schematic diagram illustrating the manner in which an analysis is made using a TEM in which an EDS is mounted. A very strong magnetic field is produced between the upper and lower polepieces of the objective lens to focus the electron beam. In order to detect a maximum portion of X-rays produced from the sample in response to electron beam irradiation, it is necessary to bring the EDS as close as possible to the sample. However, if the EDS is brought closer to the sample, the front end of the EDS comes closer to the magnetic field. If the EDS is a silicon drift X-ray detector (SDD), the magnetic field produced by the cooling Peltier device disturbs the magnetic field of the objective lens of the TEM, adversely affecting the electron beam.

Figure 7:
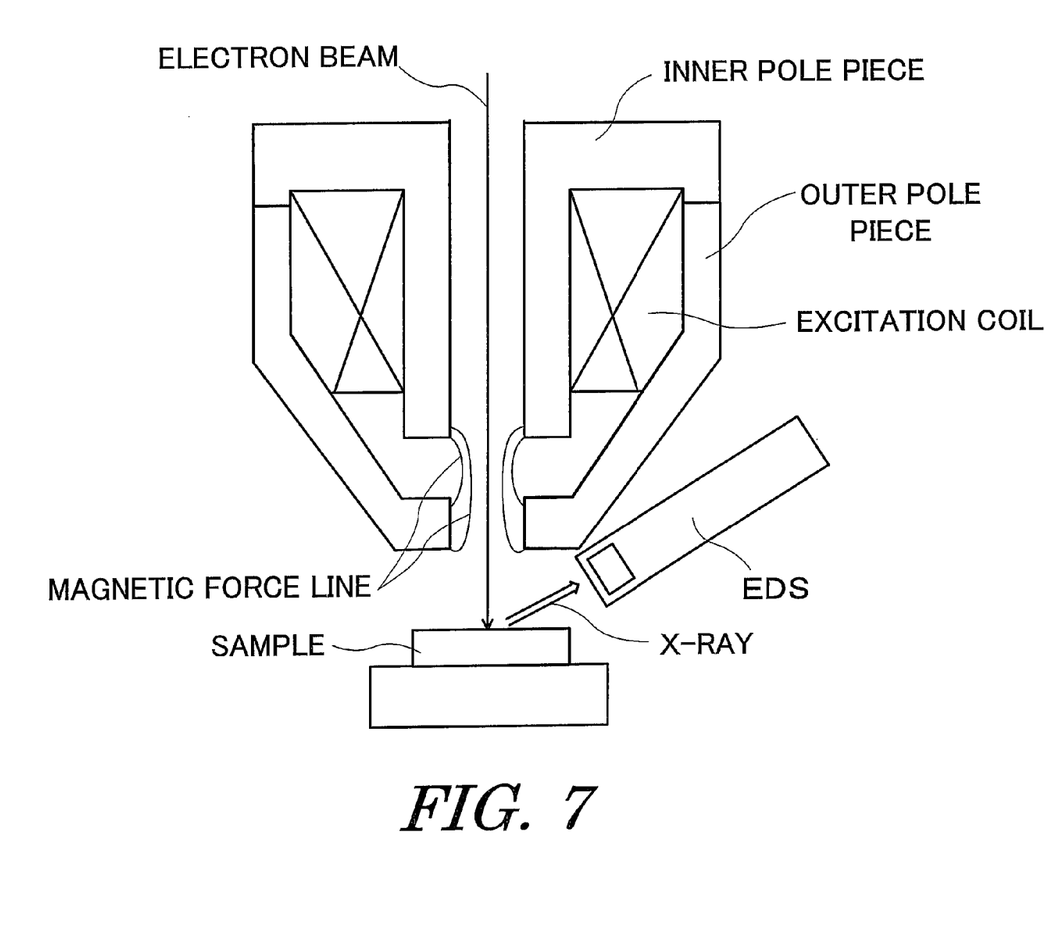
FIG. 7 is a cross-sectional view illustrating the manner in which a silicon drift X-ray detector is installed in a scanning electron microscope having an out-lens objective lens.
Figure 8:
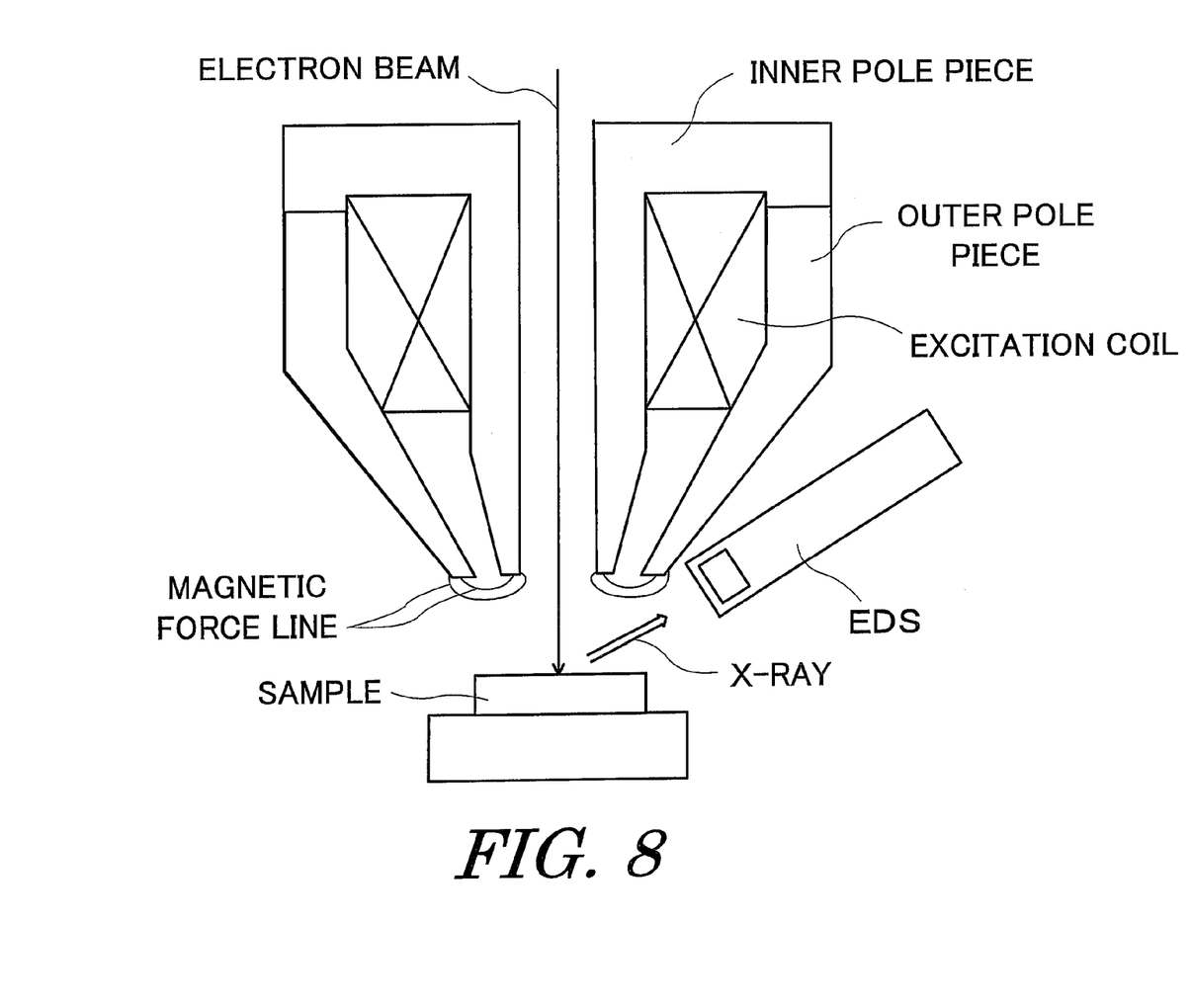
FIG. 8 is a cross-sectional view illustrating the manner in which a silicon drift X-ray detector is installed in a scanning electron microscope having an in-lens objective lens.

On the other hand, FIGS. 7 and 8 are schematic diagrams illustrating the manner in which an analysis is performed using an SEM in which an EDS is mounted. FIG. 7 shows a case in which the SEM has an out-lens objective lens. FIG. 8 shows a case in which the SEM has a semi-in lens objective lens. In the case of an out-lens objective lens, the magnetic field of the objective lens does not leak close to the location where the EDS is located. The semi-in lens objective lens permits the magnetic field of the objective lens to leak to the sample surface, thus finely focusing the electron beam. Where the magnetic field is allowed to leak to the sample surface in use, however, the purpose is to obtain a high resolution. Under this condition, the distance between the bottom surface of the objective lens and the sample surface is quite small. Therefore, it is impossible to bring the EDS close to the sample to such an extent that the leaking magnetic field is affected. Consequently, if the EDS mounted in the SEM is an SDD, the effect of the magnetic field produced from the Peltier device is weaker compared with the case where the EDS is mounted in a TEM.

That is, the problem arising from thinning of the semiconductor device of the SDD is common to both cases in which the SDD is mounted in TEM and SEM, respectively. The problem with the magnetic field produced from the Peltier device occurs when the SDD is mounted in a TEM.

SUMMARY OF THE INVENTION

It is an object of the present invention to provide a technique for reducing the background noise by suppressing X-rays which are produced secondarily by exciting the constituent elements of a cooling Peltier device with X-rays transmitted through the semiconductor device of an SDD. It is another object of the present invention to provide a technique for protecting an electron beam directed at a sample against the effect of a magnetic field produced by a cooling Peltier device in a case where an SDD is mounted in a TEM.

A first embodiment of the present invention provides a silicon drift X-ray detector for use in an energy-dispersive X-ray spectrometer installed in an X-ray analyzer that analyzes a sample by irradiating the sample with an electron beam or electromagnetic waves and spectrally detecting characteristic X-rays emanating from the sample. The X-ray detector has an X-ray detection device consisting of a solid-state semiconductor for detecting X-rays, an electrode terminal subassembly mounted to the X-ray detection device and having connector terminals for electrically connecting the X-ray detection device with an external circuit, and a Peltier device in thermal contact with the X-ray detection device via the electrode terminal subassembly to cool the X-ray detection device. A first shield made of a material consisting mainly of a chemical element having an atomic number smaller than the average atomic number of the chemical elements included in the material of the Peltier device is formed between the X-ray detection device and the Peltier device. The dose of X-rays reaching the Peltier device after being transmitted through the X-ray detection device is reduced by the first shield.

A silicon drift X-ray detector, according to a second embodiment of the present invention, is based on the silicon drift X-ray detector of the first embodiment and further characterized in that a second shield made of a material consisting mainly of a chemical element having an atomic number greater than the atomic numbers of the chemical elements included in the material of the Peltier device is formed between the first shield and the Peltier device. The amount of secondary X-rays entering the X-ray detection device after being produced from the Peltier device is reduced, the secondary X-rays being induced by X-rays reaching the Peltier device after being transmitted through the X-ray detection device.

A silicon drift X-ray detector, according to a third embodiment of the present invention, is based on the silicon drift X-ray detector of the first or second embodiment and further characterized in that the first shield is made of boron nitride or beryllia porcelain.

A silicon drift X-ray detector, according to a fourth embodiment of the present invention, is based on the silicon drift X-ray detector of the second or third embodiment and further characterized in that the second shield is made of gold leaf.

A fifth embodiment of the present invention provides a silicon drift X-ray detector for use in an energy-dispersive X-ray spectrometer mounted in an electron beam apparatus that analyzes a sample by irradiating the sample with an electron beam and spectrally detecting characteristic X-rays emanating from the sample. The X-ray detector has an X-ray detection device consisting of a solid-state semiconductor for detecting X-rays, an electrode terminal subassembly mounted to the X-ray detection device and having connector terminals for electrically connecting the X-ray detection device with an external circuit, and a Peltier device in thermal contact with the X-ray detection device via the electrode terminal subassembly to cool the X-ray detection device. A thermal conductor is mounted between the electrode terminal subassembly and the Peltier device. The thermal conductor has a length determined based on a distance necessary to keep the Peltier device away from the X-ray detection device such that a magnetic field produced by the Peltier device does not affect an electron beam used in the electron beam apparatus.

A silicon drift X-ray detector, according to a sixth embodiment of the present invention, is based on the silicon drift X-ray detector of the fifth embodiment and further characterized in that a first shield made of a material consisting mainly of a chemical element having an atomic number smaller than the average atomic number of the material of the thermal conductor is mounted between the electrode terminal subassembly and the thermal conductor. The dose of X-rays reaching the thermal conductor after being transmitted through the X-ray detection device is reduced by the first shield.

A silicon drift X-ray detector, according to a seventh embodiment of the present invention, is based on the silicon drift X-ray detector of the fifth embodiment and further characterized in that a cavity having an opening end and a bottom is formed on a side of the thermal conductor closer to the X-ray detection device.

A silicon drift X-ray detector, according to an eighth embodiment of the present invention, is based on the silicon drift X-ray detector of the seventh embodiment and further characterized in that the cavity having the bottom is shaped to have an inner wall surface on which X-rays traveling after being transmitted through the X-ray detection device obliquely impinge.

A silicon drift X-ray detector, according to a ninth embodiment of the present invention, is based on the silicon drift X-ray detector of the eighth embodiment and further characterized in that the cavity having the bottom has a conic or polyangular pyramid form. Alternatively, the cavity has an inner wall that is a parabolic surface or a curved surface not having a single focus.

A silicon drift X-ray detector, according to a tenth embodiment of the present invention, is based on the silicon drift X-ray detector of any one of the sixth through ninth embodiments and further characterized in that the first shield is made of boron nitride or beryllia porcelain.

A silicon drift X-ray detector, according to an eleventh embodiment of the present invention, is based on the silicon drift X-ray detector of any one of the sixth through tenth embodiments and further characterized in that a third shield made of a material consisting mainly of a chemical element having an atomic number greater than the atomic number of the material of the thermal conductor is mounted between the first shield and the thermal conductor, whereby the amount of secondary X-rays entering the X-ray detection device after being produced from the thermal conductor is reduced, the secondary X-rays being induced by X-rays reaching the thermal conductor after being transmitted through the X-ray detection device.

A silicon drift X-ray detector, according to a twelfth embodiment of the present invention, is based on the silicon drift X-ray detector of any one of the sixth through eleventh embodiments and further characterized in that the third shield is made of gold leaf.

A silicon drift X-ray detector, according to a thirteenth embodiment of the present invention, is based on the silicon drift X-ray detector of any one of the eighth through twelfth embodiments and further characterized in that an X-ray reducing layer made of a material consisting mainly of a chemical element having an atomic number smaller than the average atomic numbers of the elements included in the material of the thermal conductor is formed on the surface of the inner wall of the cavity having the bottom, thus reducing the efficiency at which X-rays are produced at the surface of the inner wall.

A silicon drift X-ray detector, according to a fourteenth embodiment of the present invention, is based on the silicon drift X-ray detector of the thirteenth embodiment and further characterized in that the X-ray reducing layer is made of carbon paint.

A silicon drift X-ray detector, according to a fifteenth embodiment of the present invention, is based on the silicon drift X-ray detector of the eleventh embodiment and further characterized in that at least one X-ray shield made of a material consisting mainly of a chemical element having an atomic number greater than the atomic number of the element of the material of the first shield and smaller than the atomic number of the element of the material of the second shield is formed between the first and second shields.

A silicon drift X-ray detector, according to a sixteenth embodiment of the present invention, is based on the silicon drift X-ray detector of the eleventh embodiment and further characterized in that at least one X-ray shield made of a material consisting mainly of a chemical element having an atomic number greater than the atomic number of the element of the material of the first shield and smaller than the atomic number of the element of the material of the third shield is formed between the first and third shields.

(1) According to the first embodiment of the present invention, the first shield made of a material consisting mainly of a chemical element having an atomic number smaller than the average atomic numbers of the elements included in the material of the Peltier device is mounted between the X-ray detection device and the Peltier device. The dose of X-rays reaching the Peltier device after being transmitted through the X-ray detection device is reduced by the first shield. Energies of X-rays produced from the first shield can be made lower. Therefore, the amount of secondary X-rays produced from the Peltier device is reduced. Furthermore, X-rays produced from the first shield are less easily detected by the X-ray detection device and so the background can be reduced.

(2) According to the second embodiment of the present invention, the second shield consisting mainly of a chemical element having an atomic number greater than the atomic numbers of the elements included in the material of the Peltier device is formed between the first shield and the Peltier device. The amount of secondary X-rays entering the X-ray detection device after being produced from the Peltier device can be reduced, the secondary X-rays being induced by X-rays reaching the Peltier device after being transmitted through the X-ray detection device. Therefore, the amount of secondary X-rays produced from the Peltier device and entering the X-ray detection device is reduced. The background can be reduced.

(3) According to the third embodiment of the present invention, the first shield is made of boron nitride or beryllia porcelain. Consequently, the dose of X-rays reaching the Peltier device after being transmitted through the X-ray detection device can be reduced by the first shield. Furthermore, the energies of X-rays produced from the first shield can be made lower. For these reasons, the amount of secondary X-rays produced from the Peltier device decreases. In addition, the X-rays produced from the first shield are less easily detected by the X-ray detection device. Hence, the background can be reduced.

(4) According to the fourth embodiment of the present invention, the second shield is made of gold leaf. This can reduce the amount of secondary X-rays which enter the X-ray detection device after being produced from the Peltier device, the secondary X-rays being induced by X-rays reaching the Peltier device after being transmitted through the X-ray detection device. Therefore, the amount of secondary X-rays entering the X-ray detection device after being produced from the Peltier device is reduced. As a result, the background can be reduced.

(5) According to the fifth embodiment of the present invention, the thermal conductor is mounted between the electrode terminal subassembly and the Peltier device. Therefore, the amount of secondary X-rays produced from the Peltier device is reduced. Consequently, the background can be reduced. Furthermore, the Peltier device is kept away from the X-ray detection device such that a magnetic field produced by the Peltier device does not affect an electron beam used in the electron beam apparatus. Consequently, if the detector is installed in a TEM, the electron beam directed at the sample can be prevented from being affected by the Peltier device.

(6) According to the sixth embodiment of the present invention, the first shield made of material consisting mainly of a chemical element having an atomic number smaller than the average atomic numbers of the elements included in the material of the thermal conductor is mounted between the electrode terminal subassembly and the thermal conductor. Therefore, the amount of X-rays reaching the thermal conductor after being transmitted through the X-ray detection device is reduced. Furthermore, the energies of X-rays produced from the first shield can be made lower. Consequently, the amount of the secondary X-rays that are detected by the X-ray detection device after being produced from the thermal conductor can be reduced. As a result, the background can be reduced.

(7) According to the seventh embodiment of the present invention, the cavity having the opening end and the bottom is formed on a side of the thermal conductor closer to the X-ray detection device. Therefore, X-rays entering the thermal conductor after being transmitted through the X-ray detection device produce secondary X-rays from the wall surface of the bottomed cavity. Consequently, the amount of the produced secondary X-rays detected by the X-ray detection device can be reduced. As a result, the background can be lowered.

(8) According to the eighth embodiment of the present invention, the cavity having the bottom is so shaped that it has an inner wall surface on which X-rays traveling after being transmitted through the X-ray detection device impinge obliquely. Consequently, the amount of the secondary X-rays that are detected by the X-ray detection device after being produced from the wall surface of the bottomed cavity can be reduced. As a result, the background can be reduced.

(9) According to the ninth embodiment of the present invention, the bottomed cavity formed in the thermal conductor has a conic or polyangular pyramid form. Alternatively, the cavity has an inner wall that is a parabolic surface or a curved surface not having a single focus. Consequently, the amount of the secondary X-rays that are detected by the X-ray detection device after being produced from the wall surface of the bottomed cavity can be reduced. As a result, the background can be reduced.

(10) According to the tenth embodiment of the present invention, the first shield is made of boron nitride or beryllia porcelain. Therefore, the dose of X-rays reaching the Peltier device after being transmitted through the X-ray detection device is reduced by the first shield. Furthermore, the energies of X-rays produced from the first shield can be made lower. Consequently, the amount of the secondary X-rays produced from the Peltier device decreases. In addition, X-rays produced from the first shield are less easily detected by the X-ray detection device. Hence, the background can be reduced.

(11) According to the eleventh embodiment of the present invention, the third shield made of a material consisting mainly of a chemical element having an atomic number greater than the atomic number of the material of the thermal conductor is mounted between the first shield and the thermal conductor, whereby it is possible to reduce the amount of secondary X-rays entering the X-ray detection device after being produced from the thermal conductor, the secondary X-rays being induced by X-rays reaching the thermal conductor after being transmitted through the X-ray detection device. Consequently, the amount of the secondary X-rays entering the X-ray detection device after being produced from the thermal conductor can be reduced. As a result, the background can be reduced.

(12) According to the twelfth embodiment of the present invention, the third shield is made of gold leaf and so it is possible to reduce the amount of secondary X-rays entering the X-ray detection device after being produced from the thermal conductor, the secondary X-rays being induced by X-rays reaching the thermal conductor after being transmitted through the X-ray detection device. Consequently, the amount of the secondary X-rays entering the X-ray detection device after being produced from the thermal conductor can be reduced. Hence, the background can be reduced.

(13) According to the thirteenth embodiment of the present invention, the X-ray reducing layer made of a material consisting mainly of a chemical element having an atomic number smaller than the average atomic numbers of the elements included in the material of the thermal conductor is formed on the surface of the inner wall of the cavity having the bottom, thus reducing the efficiency at which X-rays are produced at the surface of the inner wall. Therefore, it is possible to reduce the amount of secondary X-rays entering the X-ray detection device after being produced from the thermal conductor, the secondary X-rays being induced by X-rays reaching the thermal conductor after being transmitted through the X-ray detection device. In consequence, the background can be reduced.

(14) According to the fourteenth embodiment of the present invention, the X-ray reducing layer is made of carbon paint. This reduces the efficiency at which X-rays are produced from the inner wall surface of the bottomed cavity. Therefore, it is possible to reduce the amount of secondary X-rays entering the X-ray detection device after being produced from the thermal conductor, the secondary X-rays being induced by X-rays reaching the thermal conductor after being transmitted through the X-ray detection device. Consequently, the background can be reduced.

(15) According to the fifteenth embodiment of the present invention, at least one X-ray shield made of a material consisting mainly of a chemical element having an atomic number greater than the atomic number of the element of the material of the first shield and smaller than the atomic number of the element of the material of the second shield is formed between the first and second shields. Therefore, it is possible to reduce the amount of secondary X-rays entering the X-ray detection device after being produced from the Peltier device, the secondary X-rays being induced by X-rays reaching the Peltier device after being transmitted through the X-ray detection device. Consequently, the amount of the secondary X-rays entering the X-ray detection device after being produced from the Peltier device can be reduced. As a result, the background can be reduced.

(16) According to the sixteenth embodiment of the present invention, at least one X-ray shield made of a material consisting mainly of a chemical element having an atomic number greater than the atomic number of the element of the material of the first shield and smaller than the atomic number of the element of the material of the third shield is formed between the first and third shields. Therefore, it is possible to reduce the amount of secondary X-rays entering the X-ray detection device after being produced from the thermal conductor, the secondary X-rays being induced by X-rays reaching the thermal conductor after being transmitted through the X-ray detection device. Consequently, it is possible to reduce the amount of the secondary X-rays entering the X-ray detection device after being produced from the thermal conductor. As a result, the background can be reduced.

Other features and advantages of the present invention will become apparent from the following more detailed description, taken in conjunction with the accompanying drawings, which illustrate, by way of example, the principles of the present invention.

DESCRIPTION OF THE PREFERRED EMBODIMENTS

The preferred embodiments of the present invention are hereinafter described with reference with FIGS. 1 and 2. It is to be noted, however, that the technical scope of the present invention is not limited by these exemplary embodiments. Like components are indicated by like reference numerals in various figures and will not be described in detail repeatedly. In the following description, a surface of an X-ray detector on which X-rays to be detected impinge is conveniently referred to as the front surface. The opposite surface is referred to as the rear surface.

Embodiment 1

Figure 1:
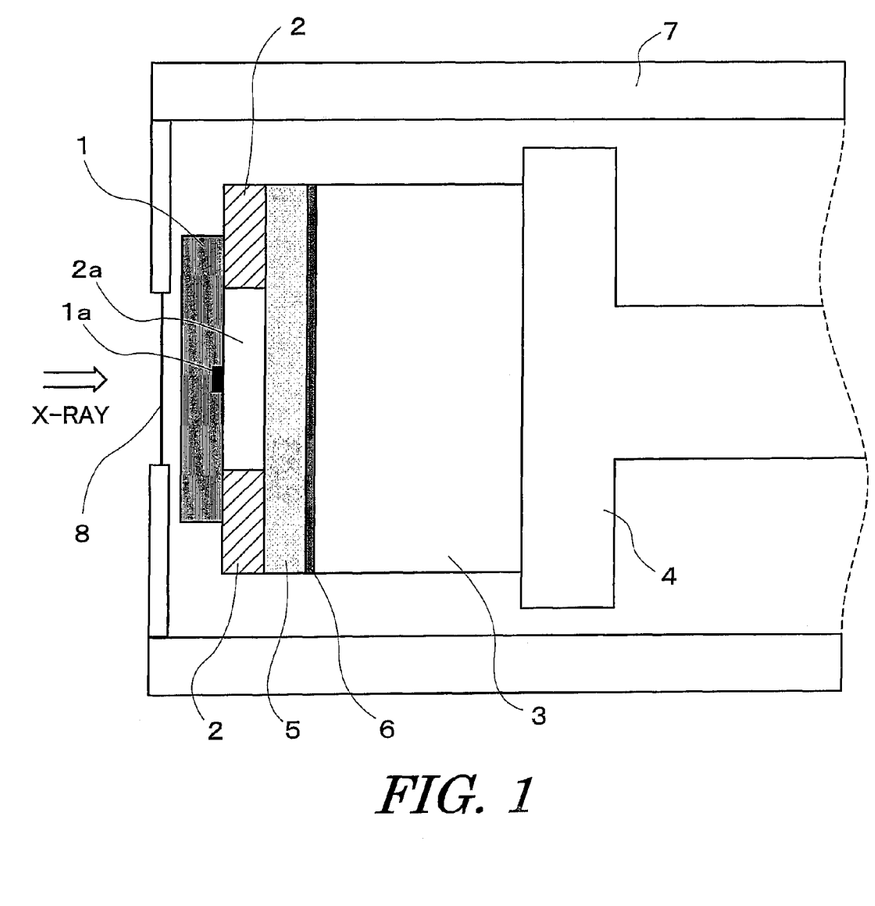
FIG. 1 is a schematic cross section of a silicon drift X-ray detector which implements the present invention.

FIG. 1 is a schematic cross section of a silicon drift X-ray detector (SDD) that implements the present invention. The detector has an X-ray detection device 1 having a rear surface to which a field-effect transistor (FET) 1a is coupled. The detector further includes an electrode terminal subassembly 2 having electrical wiring for electrical connection with the X-ray detection device 1 and the FET 1a, a Peltier device 3, a rear thermal conductor 4, a first shield 5 made of a light-element material (such as boron nitride (BN) or beryllia porcelain), a second shield 6 made of a heavy-element material, such as gold leaf, a nonmagnetic outer sheath 7 for holding the cooled SDD in a vacuum environment, and an X-ray entrance window 8. The electrode terminal subassembly 2 assumes a frame-like form and has an opening 2a. The subassembly 2 is in contact with outer peripheral portions of the X-ray detection device 1 and holds it.

Since the X-ray detection device 1 is as thin as about 0.5 mm, a major portion of X-rays transmitted through the detection device 1 enters the first shield 5. The material of the first shield 5 consists of a light element, such as nitrogen (N), boron (B), beryllium (Be), or oxygen (O). The semiconductor X-ray detector consisting mainly of silicon (Si) generally shows a maximum detection sensitivity to characteristic X-rays originating from Si out of characteristic X-rays arising from various chemical elements. The detection sensitivities to low-energy characteristic X-rays arising from light elements, such as N, B, Be, and O, are extremely low. In addition, the efficiency at which characteristic X-rays produced from light elements are excited by an electron beam is also low. Therefore, the amounts of characteristic X-rays produced from light elements are essentially low. The material of the first shield 5 at least needs to consist mainly of a chemical element having an atomic number smaller than the average atomic numbers of the elements included in the material of the Peltier device 3 (described later). Preferably, the first shield 5 is made of a material consisting of the lightest element available as described previously.

On the other hand, the material of the Peltier device 3 contains heavy elements, such as bismuth (Bi), tellurium (Te), or indium (In). Secondary X-rays produced from these heavy elements have relatively high energies and contain many characteristic X-ray species. Especially, characteristic X-ray species having energies of about 2 to 3 keV are included in an energy range to which a semiconductor X-ray detector consisting mainly of silicon (Si) exhibits a high detection sensitivity.

Therefore, the amount of secondary X-rays entering the X-ray detection device 1 from the rear surface after the X-rays are produced from the first shield 5 in response to X-rays transmitted through the X-ray detection device 1 in a case where the first shield is made of a light-element material is much smaller than the amount of secondary X-rays entering the detection device 1 from the rear surface after the X-rays are produced directly from the Peltier device 3 in the absence of the first shield. Consequently, the background originating from the secondary X-rays can be reduced.

In FIG. 1, the first shield 5 is sandwiched between the Peltier device 3 and the electrode terminal subassembly 2 and so the shield 5 needs to be made of a material having an excellent thermal conductivity. The aforementioned boron nitride (BN) and beryllia porcelain are typical materials satisfying this requirement. However, other light-element materials can also be used as long as they are excellent in thermal conductivity.

Because the material of the first shield 5 consists chiefly of a light element, some of X-rays transmitted through the X-ray detection device 1 may penetrate through the first shield 5 and reach the Peltier device 3. Since the material of the Peltier device 3 contains heavy elements, secondary X-rays having relatively high energies may be produced. To prevent such high-energy X-rays from entering the X-ray detection device 1 from the rear surface, it is better to place a second shield 6 made of a heavy-element material between the first shield 5 and the Peltier device 3.

The material of the second shield 6 needs to consist mainly of a chemical element having an atomic number at least greater than the average atomic numbers of the elements included in the material of the Peltier device 3. For the same reason as for the first shield 5, the second shield 6 needs to be made of a material having excellent thermal conductivity. The aforementioned gold leaf is a typical material satisfying this requirement. Any other material can also be used as long as it is a heavy-element material having excellent thermal conductivity.

Figure 10:
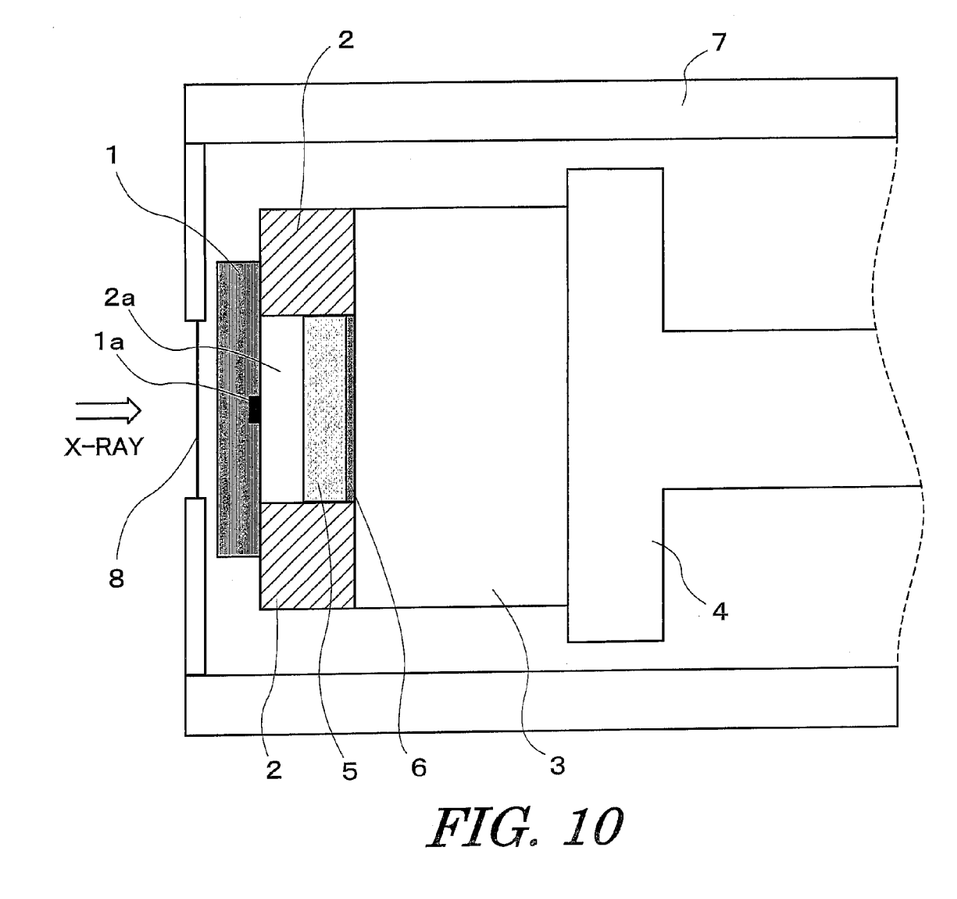
FIG. 10 is a schematic cross-sectional view of a modification of a silicon drift X-ray detector which implements the present invention.

A modification of the SDD of FIG. 1 is shown in FIG. 10. In the SDD of FIG. 10, the frame of the electrode terminal subassembly 2 is elongated, and the first shield 5 is fitted in the opening 2a. The electrode terminal subassembly 2 is in direct contact with the Peltier device 3. In this structure, if the first shield 5 is disposed, it is possible to prevent deterioration of the efficiency at which the X-ray detection device 1 and the electrode terminal subassembly 2 are cooled.

As described previously, in the SDD shown in FIG. 1, the background arising from secondary X-rays produced from the Peltier device mounted in the SDD can be reduced by placing the first shield 5 or both first shield 5 and second shield 6 in the electrode terminal subassembly 2.

In FIG. 1, both first and second shields are mounted. Alternatively, only the first shield may be mounted.

Embodiment 2

Figure 2:
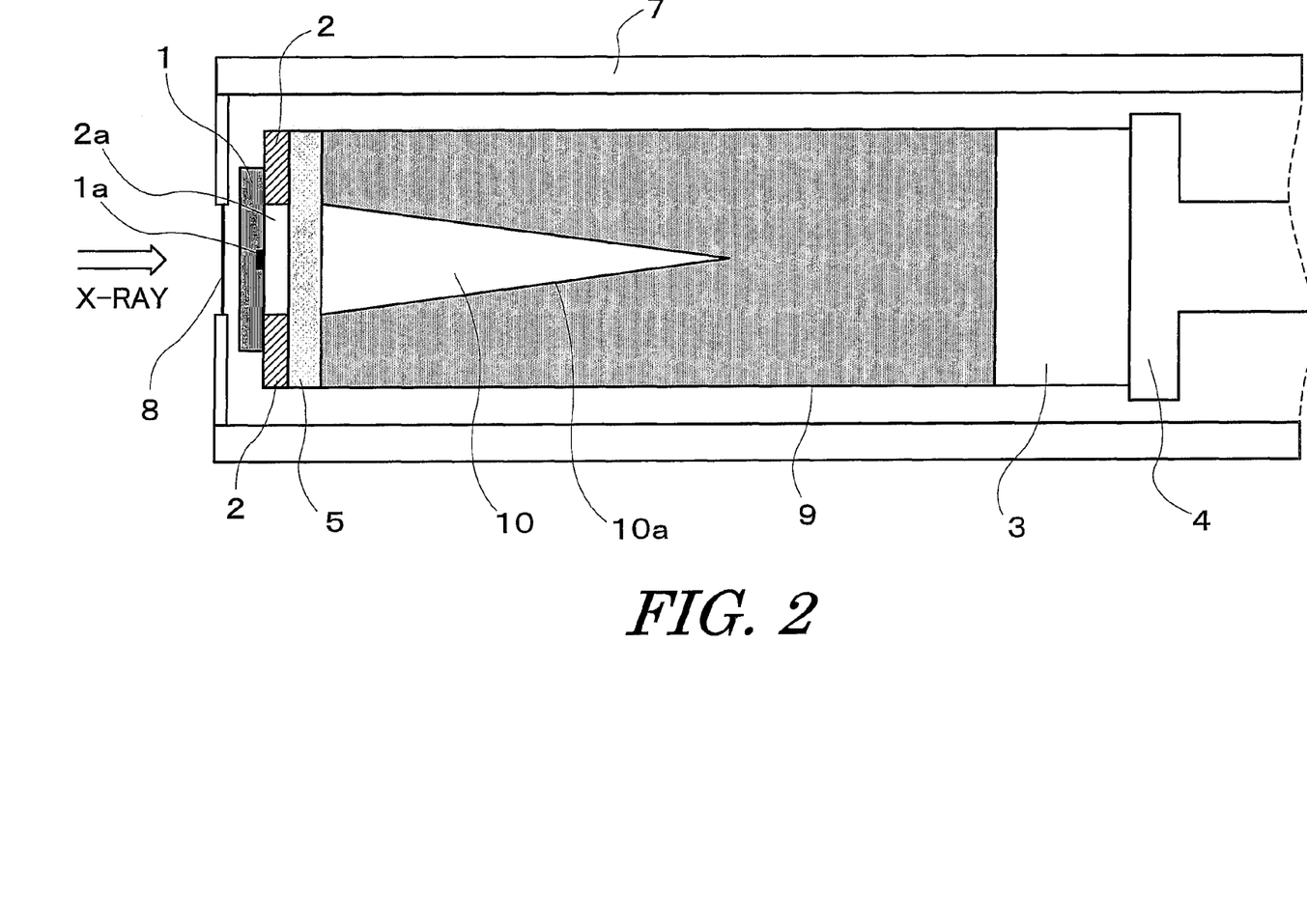
FIG. 2 is a schematic cross section of another silicon drift X-ray detector which implements the present invention.

FIG. 2 is a schematic cross section of another silicon drift X-ray detector (SDD) that implements the present invention. As described previously, a large direct current flows through a Peltier device. Where the SDD of embodiment 2 is installed in a TEM, the magnetic field produced by the current flowing through the Peltier device is prevented from affecting the electron beam.

In FIG. 2, an X-ray detection device 1 has a rear surface to which a field-effect transistor (FET) 1a is coupled. An electrode terminal subassembly 2 has electrical wiring for electrical connection with the X-ray detection device 1 and the FET 1a. The SDD further includes a Peltier device 3, a rear thermal conductor 4, a first shield 5 made of a light-element material, a nonmagnetic outer sheath 7, and an X-ray entrance window 8. The electrode terminal subassembly 2 assumes a frame-like form and is provided with an opening 2a. The subassembly 2 is in contact with the outer peripheral portions of the X-ray detection device 1 and holds it.

A thermal conductor 9 is formed between the first shield 5 and the Peltier device 3 to cool the X-ray detection device 1, which is remote from the Peltier device 3, at a maximum efficiency. Preferably, the material of the thermal conductor 9 has a maximum thermal conductivity. The material consists of a chemical element having an atomic number lower than the atomic numbers of the elements included in the material of the Peltier device to reduce the generated secondary X-rays. Metals, such as copper (Cu), that satisfy these requirements can be used.

The length of the thermal conductor 9 is determined depending on the distance between the Peltier device 3 and the X-ray detection device 1, because the degree of the effect of the Peltier device 3 on the electron beam varies depending on the objective lens structure of the TEM and on the performance of the Peltier device 3 of the SDD.

A background-reducing mechanism 10 fabricated by shaping a part of the thermal conductor 9 into a cylindrical cavity having a bottom is formed in the thermal conductor 9 from its front surface. When X-rays transmitted through the X-ray detection device 1 penetrate through the first shield 5, if the thermal conductor 9 is present immediately behind the first shield 5, secondary X-rays will be easily produced from the thermal conductor 9. However, if the cavity is formed in the thermal conductor 9 as shown in FIG. 2, the transmitted X-rays travel through the cavity and they obliquely enter the wall surface 10a of the background-reducing mechanism 10, where secondary X-rays are produced. It is generally considered that generated secondary X-rays are radiated roughly isotropically. Therefore, a major portion of the secondary X-rays is absorbed by the inside of the thermal conductor. Only a small portion of the X-rays produced at the wall surface 10a travels toward the X-ray detection device 1.

Accordingly, if the background-reducing mechanism 10 is mounted in the thermal conductor 9, the amount of secondary X-rays entering the X-ray detection device 1 from the rear surface can be reduced greatly compared with the case where the thermal conductor 9 is present immediately behind the first shield 5. In FIG. 2, the background-reducing mechanism 10 is conical in shape. The shape of the mechanism 10 is not limited to a conical form. Similar effects can be obtained if the mechanism 10 is shaped, for example, in a polyangular pyramid form or if the inner wall is a parabolic surface or a curved surface not having a single focus.

Figure 11:
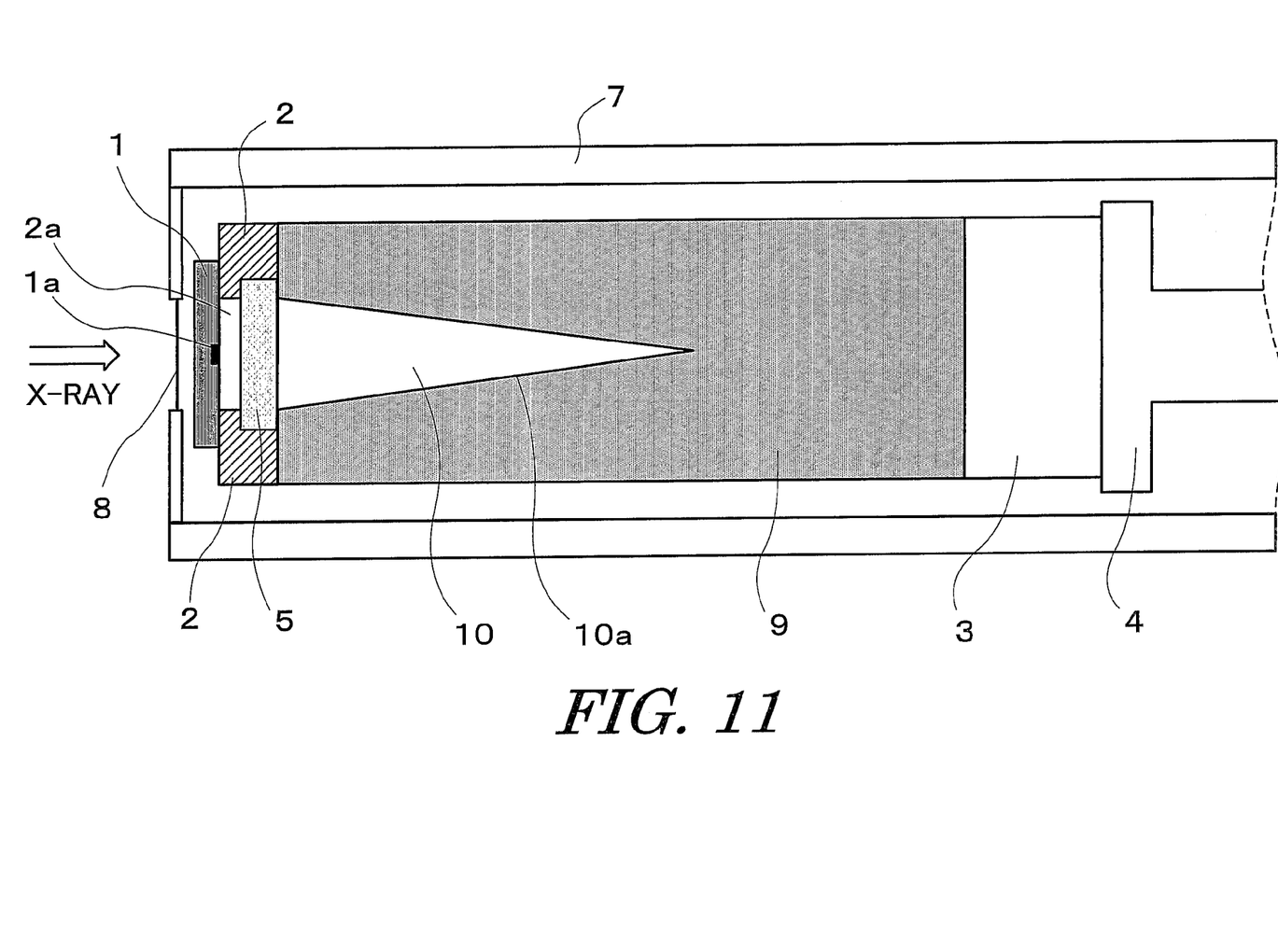
FIG. 11 is a schematic cross-sectional view of another modification of a silicon drift X-ray detector that implements the present invention.

A modification of the SDD of FIG. 2 is shown in FIG. 11. In the SDD of FIG. 11, the frame of the electrode terminal subassembly 2 is elongated and partially cut away. The first shield 5 is fitted and held in the opening 2a. Therefore, if a cavity formed by the background-reducing mechanism 10 is present, the first shield 5 can be supported reliably. Because the electrode terminal subassembly 2 is in direct contact with the Peltier device 3, if the first shield 5 is disposed, it is possible to prevent deterioration of the efficiency at which the X-ray detection device 1 and the electrode terminal subassembly 2 are cooled.

In FIG. 2, with respect to shielding bodies, only one shield body, i.e., the first shield made of a light-element body, is formed. A third shield (not shown) made of a material (such as gold leaf) consisting of a chemical element heavier than the chemical element of the material of the thermal conductor 9 may be formed between the first shield and the thermal conductor 9. The material of the third shield needs to consist mainly of a chemical element having an atomic number at least greater than the average atomic numbers of the elements included in the material of the thermal conductor 9.

In FIGS. 2 and 11, if an X-ray reducing layer made of a material consisting of a chemical element having an atomic number smaller than the atomic number of the element of the material of the thermal conductor 9 is formed on the wall surface 10a, the efficiency at which X-rays transmitted through the X-ray detection device 1 produce secondary X-rays on the wall surface 10a can be reduced. The X-ray reducing layer can be made, for example, of carbon paint.

As described thus far, according to the present invention, a first X-ray shield consisting mainly of a light-element material and a second X-ray shield consisting mainly of a heavy-element material are formed between the X-ray detection device 1 and the Peltier device 3. The background can be reduced by suppressing secondary X-rays that are produced by excitation of the constituent elements of the cooling Peltier device, by X-rays transmitted through the semiconductor device of the SDD.

Furthermore, the thermal conductor having the background-reducing mechanism is mounted between the X-ray detection device 1 and the Peltier device 3. Therefore, it is possible to prevent the magnetic field produced by the Peltier device from affecting the electron beam.

In Embodiments 1 and 2 described above, the first X-ray shield consisting mainly of a light-element material and the second X-ray shield consisting mainly of a heavy-element material are stacked on top of each other between the X-ray detection device 1 and the Peltier device 3. The present invention is not limited to this structure. For example, three or more shielding layers may be stacked on top of each other. The layer closest to the X-ray detection device 1 is made of a material consisting of the lightest element. The layer closest to the Peltier layer 3 is made of a material consisting of the heaviest element.

Having thus described our invention with the detail and particularity required by the Patent Laws, what is desired protected by Letters Patent is set forth in the following claims.

The invention claimed is:

1. A silicon drift X-ray detector for use in an energy-dispersive X-ray spectrometer mounted in an X-ray analyzer that analyzes a sample by irradiating the sample with an electron beam or electromagnetic waves and spectrally detecting characteristic X-rays emanating from the sample, said silicon drift X-ray detector comprising:

an X-ray detection device consisting of a solid-state semiconductor for detecting X-rays;
an electrode terminal subassembly mounted to the X-ray detection device and having connector terminals for electrically connecting the X-ray detection device with an external circuit; and
a Peltier device in thermal contact with the X-ray detection device via the electrode terminal subassembly to cool the X-ray detection device,
a first shield made of a material consisting mainly of a chemical element having an atomic number smaller than an average atomic number of chemical elements included in a material of the Peltier device is mounted between the X-ray detection device and the Peltier device,
a second shield made of a material consisting mainly of a chemical element having an atomic number greater than the atomic numbers of the chemical elements included in the material of the Peltier device is mounted between the first shield and the Peltier device to reduce the amount of secondary X-rays entering the X-ray detection device after being produced from the Peltier device, the secondary X-rays being induced by X-rays reaching the Peltier device after being transmitted through the X-ray detection device,
at least one X-ray shield made of a material consisting mainly of a chemical element having an atomic number greater than the atomic number of the element included in the material of the first shield and smaller than the atomic number of the element included in the material of the second shield is formed between the first and second shields, and
wherein a dose of X-rays reaching the Peltier device after being transmitted through the X-ray detection device is reduced by the first shield.

2. A silicon drift X-ray detector as set forth in claim 1, wherein said first shield is made of boron nitride or beryllia porcelain.

3. A silicon drift X-ray detector as set forth in claim 1 or 2, wherein said second shield is made of gold leaf.

4. A silicon drift X-ray detector for use in an energy-dispersive X-ray spectrometer mounted in an electron beam apparatus that analyzes a sample by irradiating the sample with an electron beam and spectrally detecting characteristic X-rays emanating from the sample, said silicon drift X-ray detector comprising:

an X-ray detection device consisting of a solid-state semiconductor for detecting X-rays;
an electrode terminal subassembly mounted to the X-ray detection device and having connector terminals for electrically connecting the X-ray detection device with an external circuit; and
a Peltier device in thermal contact with the X-ray detection device via the electrode terminal subassembly to cool the X-ray detection device,
wherein a thermal conductor is mounted between the electrode terminal subassembly and the Peltier device,
wherein the thermal conductor has a length determined based on a distance necessary to keep the Peltier device away from the X-ray detection device such that a magnetic field produced by the Peltier device does not affect an electron beam used in the electron beam apparatus, and
wherein a cavity having an opening end, an inner wall and a bottom is formed on a side of the thermal conductor that is closer to the X-ray detection device.

5. A silicon drift X-ray detector as set forth in claim 4, wherein a first shield made of a material consisting mainly of a chemical element having an atomic number smaller than an average atomic number of chemical elements included in a material of the thermal conductor is mounted between the electrode terminal subassembly and the thermal conductor, and wherein a dose of X-rays reaching the thermal conductor after being transmitted through the X-ray detection device is reduced by the first shield.

6. A silicon drift X-ray detector as set forth in claim 5, wherein said first shield is made of boron nitride or beryllia porcelain.

7. A silicon drift X-ray detector as set forth in claim 5, wherein a third shield made of a material consisting mainly of a chemical element having an atomic number greater than the atomic number of the chemical elements included in the material of the thermal conductor is mounted between the first shield and the thermal conductor, thereby reducing the amount of secondary X-rays entering the X-ray detection device after being produced from the thermal conductor, the secondary X-rays being induced by X-rays reaching the thermal conductor after being transmitted through the X-ray detection device.

8. A silicon drift X-ray detector as set forth in claim 7, wherein at least one X-ray shield made of a material consisting mainly of a chemical element having an atomic number greater than the atomic number of the element included in the material of the first shield and smaller than the atomic number of the element included in the material of the third shield is formed between the first and third shields.

9. A silicon drift X-ray detector as set forth in claim 5, wherein said third shield is made of gold leaf.

10. A silicon drift X-ray detector as set forth in claim 5, wherein an X-ray reducing layer made of a material consisting mainly of a chemical element having an atomic number smaller than the average atomic numbers of the elements included in the material of the thermal conductor is formed on a surface of the inner wall of the cavity having the bottom, thus reducing the efficiency at which X-rays are produced at the surface of the inner wall.

11. A silicon drift X-ray detector as set forth in claim 10, wherein said X-ray reducing layer is made of carbon paint.

12. A silicon drift X-ray detector as set forth in claim 4, wherein said cavity having the bottom is shaped to have an inner wall surface on which X-rays traveling after being transmitted through the X-ray detection device obliquely impinge.

13. A silicon drift X-ray detector as set forth in claim 12, wherein said cavity having the bottom has a conic or polyangular pyramid form or the cavity has an inner wall that is a parabolic surface or a curved surface not having a single focus.

* * * * *